US006650064B2

United States Patent
Guthrie et al.

(10) Patent No.: US 6,650,064 B2
(45) Date of Patent: Nov. 18, 2003

(54) FAULT TOLERANT LED DISPLAY DESIGN

(75) Inventors: Don W. Guthrie, North Richland Hills, TX (US); Craig Jay Coley, Burleson, TX (US)

(73) Assignee: Aerospace Optics, Inc., Fort Worth, TX (US)

( * ) Notice: Subject to any disclaimer, the term of this patent is extended or adjusted under 35 U.S.C. 154(b) by 31 days.

(21) Appl. No.: 09/949,370

(22) Filed: Sep. 7, 2001

(65) Prior Publication Data

US 2002/0047596 A1 Apr. 25, 2002

Related U.S. Application Data

(63) Continuation-in-part of application No. 09/675,752, filed on Sep. 29, 2000, now Pat. No. 6,323,598.

(51) Int. Cl.[7] .............................. H05B 37/00; F21S 4/00
(52) U.S. Cl. ................................... 315/185 R; 362/800
(58) Field of Search ........................... 315/185 R, 191, 315/192, 200 R, 289; 362/800

(56) References Cited

U.S. PATENT DOCUMENTS

| | | | | |
|---|---|---|---|---|
| 4,463,402 A | * | 7/1984 | Cottrell | 361/77 |
| 4,939,426 A | * | 7/1990 | Menard et al. | 315/192 |
| 5,187,377 A | * | 2/1993 | Katoh | 257/89 |
| 5,313,187 A | | 5/1994 | Choi et al. | 340/331 |
| 5,608,290 A | | 3/1997 | Hutchisson et al. | 315/200 A |
| 5,929,568 A | | 7/1999 | Eggers | 315/56 |
| 5,936,599 A | * | 8/1999 | Reymond | 345/82 |
| 5,939,839 A | * | 8/1999 | Robel et al. | 315/289 |
| 5,959,413 A | | 9/1999 | Komarek et al. | 315/306 |
| 6,043,501 A | * | 3/2000 | Franckart et al. | 250/551 |
| 6,246,186 B1 | * | 6/2001 | Nieberger | 315/291 |
| 6,249,088 B1 | | 6/2001 | Chang | 315/185 R |
| 6,252,638 B1 | | 6/2001 | Johnson et al. | 349/5 |
| 6,288,497 B1 | | 9/2001 | Chang et al. | 315/185 R |
| 6,323,598 B1 | * | 11/2001 | Guthrie et al. | 315/200 A |
| 6,419,372 B1 | | 7/2002 | Shaw et al. | 362/231 |

FOREIGN PATENT DOCUMENTS

| | | | |
|---|---|---|---|
| EP | 0 695 112 A1 | 1/1996 | H05B/33/08 |
| EP | 0 890 894 A1 | 1/1999 | G05F/1/00 |
| EP | 0 991 304 A2 | 4/2000 | H05B/41/38 |
| WO | WO 99/20085 | 4/1999 | |

* cited by examiner

*Primary Examiner*—Don Wong
*Assistant Examiner*—Minh Dn A

(57) ABSTRACT

A zener diode is connected in parallel with sets of series-connected light emitting diodes with a reverse forward bias orientation. The threshold voltage of the zener diode is matched to equal, or be just slightly greater than, the forward voltage drops for the light emitting diodes at maximum current. During normal operation, therefore, the zener diode draws virtually no current. Upon failure of one of the light emitting diodes, the zener diode conducts without increase in the applied voltage, providing an alternate current path maintaining circuit integrity so that other sets of light emitting diodes connected in series within the circuit continue to illuminate.

20 Claims, 2 Drawing Sheets

FAULT TOLERANT LED DISPLAY DESIGN

CROSS-REFERENCE TO RELATED APPLICATIONS

This application is related to and claims priority as a continuation-in-part of U.S. Pat. No. 6,323,598 entitled ENHANCED TRIM RESOLUTION VOLTAGE-CONTROLLED DIMMING LED DRIVER, and is also related to the subject matter of commonly assigned, co-pending U.S. patent application Ser. No. 09/949,139 entitled VOLTAGE DIMMABLE LED DISPLAY PRODUCING MULTIPLE COLORS and filed Sep. 7, 2001. The content of the above-identified applications axe hereby incorporated by reference.

TECHNICAL FIELD OF THE INVENTION

The present invention is directed, in general, to driver circuits for light emitting diode illumination sources and, more specifically, to voltage-controlled dimming driver circuits for light emitting diode illumination sources capable of providing illumination despite failure of one or more light emitting diodes within the illumination source.

BACKGROUND OF THE INVENTION

Commercial and military aircraft instrumentation displays, like many other display systems, frequently employ illuminated indicators and controls. Traditionally, incandescent lamps operating at 5 VAC, 14 VDC or 28 VDC have been employed as illumination sources for illuminated pushbutton switches, indicators and annunciators within aircraft instrumentation. The illumination from such incandescent lamps is generally optically filtered to produce a wide range of human visible or night vision imaging system (NVIS) colors, and the small size of incandescent lamps allows multiple lamps to be used within the same display to illuminate different regions of the display in different colors.

The inherent characteristics of incandescent lamps, however, lead to noticeable chromaticity shifts as the applied voltage is reduced to adjust the output luminance from sunlight readability in daytime flying conditions to low luminance levels required for night flying conditions. Moreover, incandescent lamps suffer other disadvantages when employed in aircraft instrumentation, including high power consumption, high inrush current, uncomfortably high touch temperatures, and unreliability in high vibration environments. As a result, considerable effort has been expended to incorporate more stable, efficient and reliable technologies, such as light emitting diodes (LEDs), into aircraft crewstation illuminated displays. Light emitting diodes offer high luminous efficiency, low heat, low power consumption and high reliability.

The luminance required for aircraft instrumentation displays ranges up to approximately 400–500 foot-lamberts for sunlight-readability in daytime flying. In order to provide sufficient illumination to be visible in direct sunlight, multiple light emitting diodes may be required. For example, FIGS. 3A and 3B depict circuit diagrams for driver configurations which might be employed in light emitting diode illumination sources for aircraft instrumentation. Drivers 300 and 301 each include a biasing resistor R2 and a set of light emitting diodes L1–L4 connected in series between input and output ports ("+" and "−") to which the input voltage is applied. In driver 300, the light emitting diodes L1–L4 are connected in parallel. Unfortunately, the power consumption of parallel light emitting diodes increases linearly with each additional light emitting diode, and can even consume as much power as the incandescent lamps which the light emitting diode illumination sources are designed to replace.

By connecting the light emitting diodes L1–L4 in series, as in driver 301, maximum power efficiency can be realized. Since current is constant in series-connected light emitting diodes, the power consumed by a display containing multiple series-connected light emitting diodes is no more than that consumed by a display containing only a single light emitting diode, while the total luminance increases with each light emitting diode added.

In a series-connected configuration such as driver 301, however, if any of light emitting diodes L1–L4 fails in an electrically open state, the entire string of light emitting diodes is rendered nonfunctional.

There is, therefore, a need in the art for a light emitting diode illumination source providing both power efficiency and fault tolerance for failure of one or more light emitting diodes in an electrically open condition.

SUMMARY OF THE INVENTION

To address the above-discussed deficiencies of the prior art, it is a primary object of the present invention to provide, for use in a light emitting diode illumination source, a fault tolerance for failure of one light emitting diode within a series-connected group. In the present invention, such fault tolerance is provided by a zener diode connected in parallel with sets of series-connected light emitting diodes with a reverse forward bias orientation. The threshold voltage of the zener diode is matched to equal, or be just slightly greater than, the forward voltage drops for the light emitting diodes at maximum current. During normal operation, therefore, the zener diode draws virtually no current. Upon failure of one of the light emitting diodes, the zener diode conducts without increase in the applied voltage, providing an alternate current path maintaining circuit integrity so that other sets of light emitting diodes connected in series within the circuit continue to illuminate.

The foregoing has outlined rather broadly the features and technical advantages of the present invention so that those skilled in the art may better understand the detailed description of the invention that follows. Additional features and advantages of the invention will be described hereinafter that form the subject of the claims of the invention. Those skilled in the art will appreciate that they may readily use the conception and the specific embodiment disclosed as a basis for modifying or designing other structures for carrying out the same purposes of the present invention. Those skilled in the art will also realize that such equivalent constructions do not depart from the spirit and scope of the invention in its broadest form.

Before undertaking the DETAILED DESCRIPTION OF THE INVENTION below, it may be advantageous to set forth definitions of certain words or phrases used throughout this patent document: the terms "include" and "comprise," as well as derivatives thereof, mean inclusion without limitation; the term "or" is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, whether such a device is implemented in hardware, firmware, software or some combination of at least two of the same. It should be noted that the functionality associated with any particular controller may be centralized or distributed, whether locally or remotely. Definitions for certain words and phrases are provided throughout this patent document, and those of ordinary skill in the art will understand that such definitions apply in many, if not most, instances to prior as well as future uses of such defined words and phrases.

BRIEF DESCRIPTION OF THE DRAWINGS

For a more complete understanding of the present invention, and the advantages thereof, reference is now made to the following descriptions taken in conjunction with the accompanying drawings, wherein like numbers designate like objects, and in which.

DETAILED DESCRIPTION OF THE INVENTION

Figure 1A:
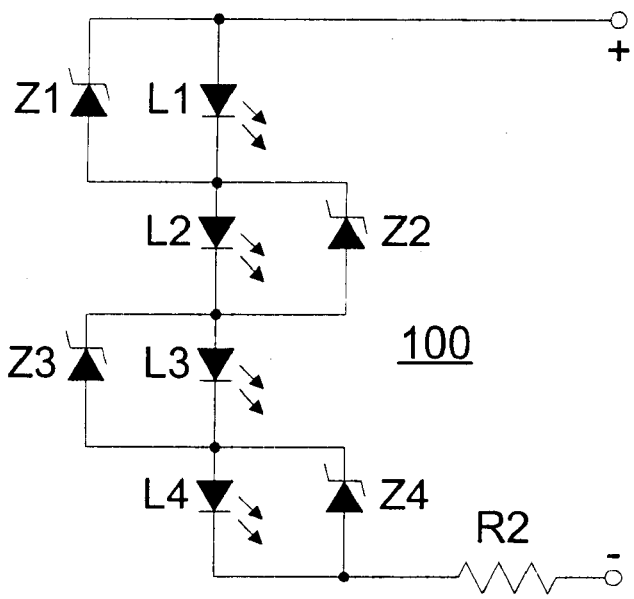
FIGS. 1A and 1B depict circuit diagrams for fault tolerant light emitting diode driver circuits according to various embodiments of the present invention.
Figure 1B:
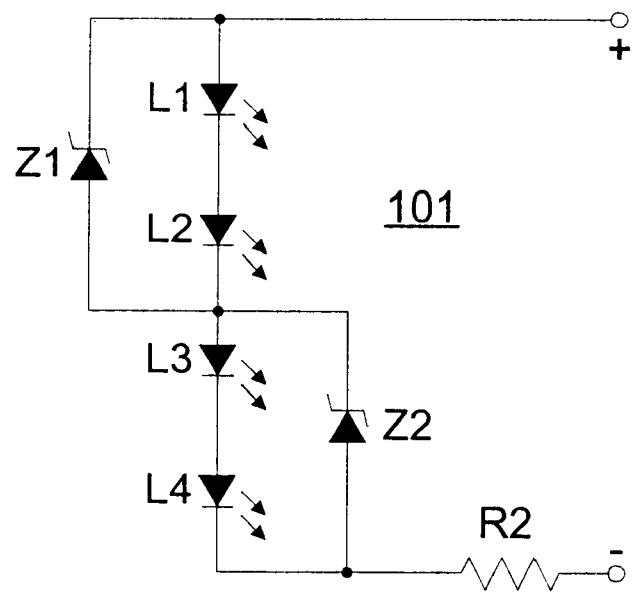
Figure 2:
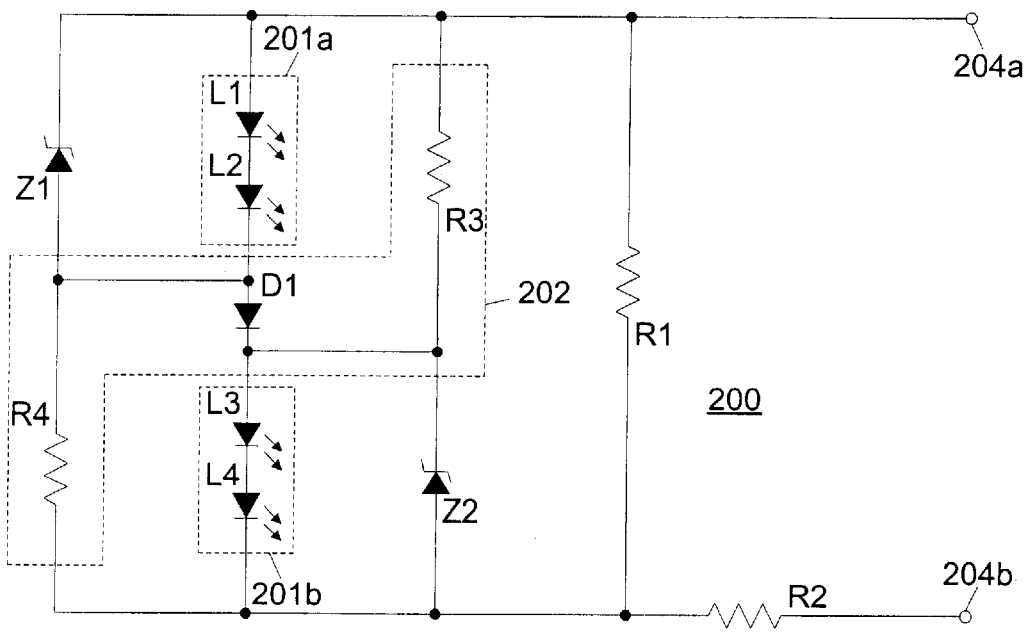
FIG. 2 is a circuit diagram for a fault tolerant voltage-controlled dimming light emitting diode driver according to another embodiment of the present invention.
Figure 3A:
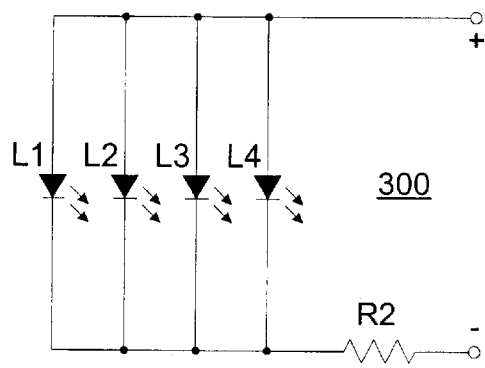
FIGS. 3A–3B are circuit diagrams for simple light emitting diode drivers.
Figure 3B:
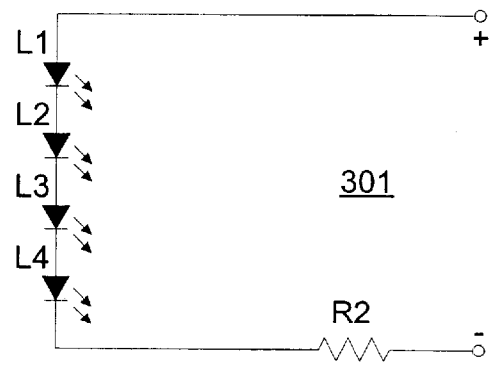

FIGS. 1A, 1B and 2, discussed below, and the various embodiments used to describe the principles of the present invention in this patent document are by way of illustration only and should not be construed in any way to limit the scope of the invention. Those skilled in the art will understand that the principles of the present invention may be implemented in any suitably arranged device.

FIGS. 1A and 1B depict circuit diagrams for fault tolerant light emitting diode driver circuits according to various embodiments of the present invention. Drivers 100 and 101 each include a biasing resistor R2 and a set of series-connected light emitting diodes L1–L4 connected in series between input and output ports ("+" and "−") to which the input voltage is applied. In order to realize the power savings of series-connected light-emitting diodes with the catastrophic loss of the entire set of light emitting diodes L1–L4 should a single light emitting diode within the set fail in an electrically open state, zener diodes Z1–Z4 are connected in parallel with each light emitting diode L1–L4.

Zener diodes Z1–Z4 have a forward bias orientation opposite that of the corresponding light emitting diode L1–L4—i.e., the anode of each zener diode Z1–Z4 is connected to the cathode of the corresponding light emitting diode L1–L4 while the cathode of each zener diode Z1–Z4 is connected to the anode of the corresponding light emitting diode L1–L4. Zener diodes Z1–Z4 provide an alternate current path if the counterpart light emitting diode L1–L4 fails in an electrically open state, maintaining circuit integrity so that the remaining light emitting diodes can continue to illuminate.

To reduce the number of components, a single zener diode may be connected in parallel with two or more light emitting diodes, providing a route-around current path bypassing a failed light emitting diode (and other light emitting diodes in the same group around which the zener diode is connected) to render the circuit fault tolerant. FIG. 1B depicts a circuit diagram for a variant driver 101 in which zener diodes Z1–Z2 are each connected in parallel with a pair of light emitting diodes L1/L2 and L3/L4.

The reverse breakdown threshold voltage of each zener diode should preferably be selected to be just slightly greater than or equal to the maximum forward bias voltage drop(s) (i.e., the forward voltage drop at maximum current) across the light emitting diode(s) for which the zener diode provides a circuit bypass. In such cases, the zener diode will draw virtually no current in normal operation, but will not require a substantial increase in the applied input voltage to activate the route-around current path in the event a parallel light emitting diode fails.

The design of FIG. 1B, where each zener diode is connected in parallel around two light emitting diodes, is therefore preferred. Should any light emitting diode L1–L4 in the series-connected circuit suffer a failure, the primary current path will revert through one of the zener diodes Z1–Z2 without requiring an increase in the applied input voltage, retaining illumination of at least one-half of the light emitting diodes. More complex configurations involving active switching circuits may also be employed if desired to provide additional fault tolerance, or fault tolerance which is better matched to the forward voltage drops of the light emitting diodes.

FIG. 2 is a circuit diagram for a fault tolerant voltage-controlled dimming light emitting diode driver according to another embodiment of the present invention. Circuit 200 includes four white light emitting diodes L1–L4 series-connected in pairs L1/L2 and L3/L4 within two LED groups 201a and 201b. A switching circuit 202 is connected between LED groups 201a and 201b to switch LED groups 201a and 201b from series-connection between input and output ports 204a and 204b to parallel-connection, or vice-versa, as the voltage applied across input and output ports 204a–204b is varied across a threshold or "kickover" value.

Switching circuit 202 includes a switching diode D1 connected in series between LED groups 201a and 201b, a first resistor R3 connected in parallel with both LED group 201a and switching diode D1, and a second resistor R4 connected in parallel with both LED group 201b and switching diode D1.

The cathode of switching diode D1 is connected to the anode of the last light emitting diode L2 (in the direction of the forward voltage drop across the LEDs) within LED group 201a and to one end of resistor R4; the anode of switching diode D1 is connected to the cathode of the first light emitting diode L3 with LED group 201b and to one end of resistor R3. An opposite end of resistor R3 is connected to the cathode of the first light emitting diode L1 within LED group 201a, and an opposite end of resistor R4 is connected to the anode of the last light emitting diode L4 within LED group 201b.

LED groups 201a and 201b (comprising light emitting diode pairs L1/L2 and L3/L4) are connected by switching circuit 202 either in series or in parallel between input and output ports 204a–204b, depending on the voltage applied across the input and output ports 204a–204b. Switching circuit 202 provides kickover from parallel-connection to series-connection, and vice-versa, of LED groups 201a–201b. Switching diode D1 and resistors R3 and R4 enable the switching mechanism.

In operation, circuit 200 operates in two modes: high luminance mode above the kickover point, where the applied input voltage across ports 204a–204b is greater than the combined forward voltage drops (turn-on voltages) of light emitting diodes L1–L4 and switching diode D1; and low luminance mode below the kickover point, where the applied input voltage across ports 204a–204b is less than the combined forward voltage drops of light emitting diodes L1–L4 and switching diode D1 (but greater than the combined forward voltage drops of either of light emitting diode pairs l1/L2 or L3/L4).

In high luminance mode, switching diode D1 conducts, and most of the current between ports 204a–204b passes through the series connected path of light emitting diode pair L1/L2, switching diode D1, and light emitting diode L3/L4. The primary current path for high luminance control is established by the high luminance resistor R2.

In low luminance mode, switching diode D1 stops conducting and the current passes through the two parallel paths comprising: light emitting diode pair L1/L2 and resistor R4; and resistor R3 and light emitting diode pair L3/L4. Low luminance mode therefore results when the applied input voltage is insufficient to allow forward current to flow through switching diode D1. The primary current path for low luminance control is established by low luminance resistors R3–R4.

Resistor R1 provides a quiescent current path to prevent false or unintentional illumination at low current levels, which otherwise may produce detectable illumination at levels of as low as a few microamperes ($\mu$A). In addition to setting the kickover point as a function of input voltage applied across ports 204a–204b, resistor R2 serves to limit the current of a transient or overvoltage event and also serves to limit the operating current to safe levels in order to prevent a catastrophic failure of the display circuitry.

Zener diodes Z1 and Z2, in conjunction with high luminance resistor R2, provide circuit protection against transients, conducted electromagnetic susceptibility, or an electrostatic discharge event. Zener diodes Z1 and Z2 also prevent failure of the entire set of light emitting diodes L1–L4 should a single light emitting diode L1–L4 fail in an electrically open state, providing an alternate current path to maintain circuit integrity with two light emitting diodes still illuminating under such a catastrophic failure condition.

Exemplary values for the relevant components depicted in FIG. 2 are: resistor R1=4.32 kiloohms (K$\Omega$); resistor R2=1.5 K$\Omega$; resistors R3 and R4=20 K$\Omega$; light emitting diodes L1–l4 each having forward voltage drops in the range 2.5–3.3 VDC; and zener diodes Z1–Z2 are rated for about 6.6 VDC.

Within light emitting diode illumination sources, the present invention obtains the power efficiency benefits of series-connecting light emitting diodes while avoiding complete failure of the illumination source should a single light emitting diode fail in an electrically open state. By matching the threshold voltage of the zener diode to the forward voltage drops of one or more series-connected light emitting diodes connected in parallel with the zener diode, current draw by the zener diode during normal operation is kept to essentially zero while an alternate current path is activated upon failure of a light emitting diode without increasing the applied voltage.

Although the present invention has been described in detail, those skilled in the art will understand that various changes, substitutions, variations, enhancements, nuances, gradations, lesser forms, alterations, revisions, improvements and knock-offs of the invention disclosed herein may be made without departing from the spirit and scope of the invention it its broadest form.

What is claimed is:

1. For use in a light emitting diode illumination source, a circuit for tolerating failure of one light emitting diode within a series-connected group comprising:

two or more sets of light emitting diodes connected in series with a common forward bias orientation to form a primary current path when all light emitting diodes within each set are operating; and two or more devices each connected in parallel with a corresponding set of light emitting diodes, each device having a threshold voltage for conducting current which is greater than or equal to combined forward voltage drops at maximum current for all light emitting diodes within the respective set, wherein each device provides an alternate current path upon failure of any light emitting diode within the respective set.

2. The circuit as set forth in claim 1 wherein the two or more devices each comprise a zener diode connected with a forward bias orientation opposite a forward bias orientation of light emitting diodes within the corresponding set of light emitting diodes.

3. The circuit as set forth in claim 2 wherein the two or more sets of light emitting diodes each comprise a single light emitting diode.

4. The circuit as set forth in claim 2 wherein the two or more sets of light emitting diodes each comprise a pair of series-connected light emitting diodes.

5. For use in a light emitting diode illumination source, a circuit for tolerating failure of one light emitting diode within a series-connected group comprising:

two or more sets of light emitting diodes connected in series, each set of light emitting diodes comprising a pair of series-connected light emitting diodes; and two or more devices each connected in parallel with a corresponding set of light emitting diodes, each device comprising a zener diode connected with a forward bias orientation opposite a forward bias orientation of light emitting diodes within the corresponding set of light emitting diodes and having a threshold voltage for conducting current which is greater than or equal to combined forward voltage drops at maximum current for all light emitting diodes within the respective set, wherein each device provides an alternate current path upon failure of any light emitting diode within the respective set, and wherein each zener diode has a reverse breakdown threshold voltage which is approximately equal to combined forward voltage drops at maximum current for both light emitting diodes within the corresponding set of light emitting diodes.

6. For use in a light emitting diode illumination source, a circuit for tolerating failure of one light emitting diode within a series-connected group comprising:

two or more sets of light emitting diodes connected in series; and two or more devices each connected in parallel with a corresponding set of light emitting diodes, each device having a threshold voltage for conducting current which is greater than or equal to combined forward voltage drops at maximum current for all light emitting diodes within the respective set, wherein each device provides an alternate current path upon failure of any light emitting diode within the respective set, and wherein, upon failure of a light emitting diode within one of the two or more sets of light emitting diodes in an electrically open state, light emitting diodes within each remaining set of light emitting diodes continue to illuminate in response to an applied input voltage.

7. For use in a light emitting diode illumination source, a circuit for tolerating failure of one light emitting diode within a series-connected group comprising:

two or more sets of light emitting diodes connected in series; and two or more devices each connected in parallel with a corresponding set of light emitting diodes, each device having a threshold voltage for conducting current which is greater than or equal to combined forward voltage drops at maximum current for all light emitting diodes within the respective set, wherein each device provides an alternate current path upon failure of any light emitting diode within the respective set, and wherein all light emitting diodes within the two or more sets of light emitting diodes are connected in series between input and output ports for the circuit, and wherein at least one set of light emitting diodes continues to illuminate in response to an input voltage across the input and output ports after failure in an electrically open state of one or more light emitting diodes within one or more other of the sets of light emitting diodes.

8. For use with a light emitting diode illumination source, a method of tolerating failure of one light emitting diode within a series-connected group comprising:

applying a voltage across an input port and an output port of a light emitting diode driver circuit to drive:

two or more sets of light emitting diodes connected in series with a common forward bias orientation to form a primary current path when all light emitting diodes within each set are operating; and two or more devices each connected in parallel with a corresponding set of light emitting diodes, each device having a threshold voltage for conducting current which is greater than or equal to combined forward voltage drops at maximum current for all light emitting diodes within the respective set, wherein each device provides an alternate current path upon failure of any light emitting diode within the respective set.

9. The method as set forth in claim 8 wherein the two or more devices each comprise a zener diode connected with a forward bias orientation opposite a forward bias orientation of light emitting diodes within the corresponding set of light emitting diodes.

10. The method as set forth in claim 9 wherein the two or more sets of light emitting diodes each comprise a single light emitting diode.

11. The method as set forth in claim 9 wherein the two or more sets of light emitting diodes each comprise a pair of series-connected light emitting diodes.

12. The method as set forth in claim 11 wherein each zener diode has a reverse breakdown threshold voltage which is approximately equal to combined forward voltage drops at maximum current for both light emitting diodes within the corresponding set of light emitting diodes.

13. The method as set forth in claim 8 wherein, upon failure of a light emitting diode within one of the two or more sets of light emitting diodes in an electrically open state, light emitting diodes within each remaining set of light emitting diodes continue to illuminate in response to the voltage.

14. The method as set forth in claim 8 wherein all light emitting diodes within the two or more sets of light emitting diodes are connected in series between the input and output ports for the circuit, and wherein at least one set of light emitting diodes continues to illuminate in response to the voltage after failure in an electrically open state of one or more light emitting diodes within one or more other of the sets of light emitting diodes.

15. A circuit for voltage-controlled dimming of light emitting diodes comprising:

first and second light emitting diode groups connected between an input port and an output port;

a switching circuit coupled to the first and second light emitting diode groups, wherein the switching circuit switches the first and second light emitting diode groups between series-connection and parallel-connection; and first and second devices each connected in parallel with, respectively, the first and second light emitting diode groups, each device having a threshold voltage for conducting current which is greater than or equal to combined forward voltage drops at maximum current for all light emitting diodes within the respective light emitting diode group, wherein each device provides an alternate current path upon failure of any light emitting diode within the respective light emitting diode group.

16. The circuit as set forth in claim 15 wherein the first and second devices each comprise a zener diode connected with a forward bias orientation opposite a forward bias orientation of light emitting diodes within the corresponding light emitting diode group.

17. The circuit as set forth in claim 16 wherein the first and second light emitting diode groups each comprise a pair of series-connected light emitting diodes.

18. The circuit as set forth in claim 17 wherein each zener diode has a reverse breakdown threshold voltage which is approximately equal to combined forward voltage drops at maximum current for both light emitting diodes within the corresponding light emitting diode group.

19. The circuit as set forth in claim 15 wherein, upon failure of a light emitting diode within one of the first and second light emitting diode groups in an electrically open state, light emitting diodes within the other of the first and second light emitting diode groups continue to illuminate in response to an applied input voltage.

20. The circuit as set forth in claim 15 wherein all light emitting diodes within the first and second light emitting diode groups are connected in series between input and output ports for the circuit, and wherein light emitting diodes within one of the first and second light emitting diode groups continue to illuminate in response to an input voltage across the input and output ports after failure in an electrically open state of one or more light emitting diodes within the other of the first and second light emitting diode groups.

* * * * *